(12) United States Patent
Granzer et al.

(10) Patent No.: US 8,358,133 B2
(45) Date of Patent: Jan. 22, 2013

(54) MRI BODY COIL CONNECTED TO A FRANGIBLE RETENTION FRAME CIRCUIT BOARD ASSEMBLY AND METHOD FOR ATTACHING AN ELECTRONIC MODULE TO A BODY COIL OF A MAGNETIC RESONANCE APPARATUS

(75) Inventors: Alexander Granzer, Lauf A.D. Pegnitz (DE); Razvan Lazar, Erlangen (DE); Wolfgang Renz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 334 days.

(21) Appl. No.: 12/692,053

(22) Filed: Jan. 22, 2010

(65) Prior Publication Data

US 2010/0182010 A1    Jul. 22, 2010

(30) Foreign Application Priority Data

Jan. 22, 2009  (DE) .......................... 10 2009 005 644

(51) Int. Cl.
*G01V 3/00* (2006.01)
(52) U.S. Cl. ......... 324/322; 324/307; 324/318; 324/321
(58) Field of Classification Search .......... 324/300–322; 600/407–435; 382/128–131
See application file for complete search history.

(56) References Cited

U.S. PATENT DOCUMENTS

| 2,329,634 | A | * | 9/1943 | McDonald, Jr. | 343/866 |
|---|---|---|---|---|---|
| 3,229,599 | A | * | 1/1966 | Lowe | 270/52.14 |
| 5,168,230 | A | * | 12/1992 | Hashoian et al. | 324/318 |
| 6,215,307 | B1 | * | 4/2001 | Sementchenko | 324/318 |
| 7,518,368 | B2 | | 4/2009 | Festag et al. | 607/116 |
| 7,518,372 | B2 | * | 4/2009 | Schilling et al. | 324/322 |
| 7,733,088 | B2 | * | 6/2010 | Cho et al. | 324/318 |
| 2007/0232953 | A1 | * | 10/2007 | Dietz et al. | 600/562 |
| 2010/0164675 | A1 | * | 7/2010 | Eberler et al. | 336/84 R |
| 2010/0182010 | A1 | * | 7/2010 | Granzer et al. | 324/322 |
| 2010/0298693 | A1 | * | 11/2010 | Dietz et al. | 600/410 |
| 2011/0039164 | A1 | * | 2/2011 | Akers et al. | 429/401 |

FOREIGN PATENT DOCUMENTS

DE  199 36 013  3/2001

* cited by examiner

*Primary Examiner* — Melissa Koval
*Assistant Examiner* — Tiffany Fetzner
(74) *Attorney, Agent, or Firm* — Schiff Hardin LLP

(57) ABSTRACT

Efficient mounting of a module to a whole-body coil of a magnetic resonance apparatus is enabled by a circuit board with conductive contact regions located at least in the area of an edge of the circuit board, with which contact regions contacts of an electronic module for a magnetic resonance apparatus are connected in a conductive manner. The contact regions of the circuit board are configured for electrical contact with the whole-body coil.

16 Claims, 6 Drawing Sheets

MRI BODY COIL CONNECTED TO A FRANGIBLE RETENTION FRAME CIRCUIT BOARD ASSEMBLY AND METHOD FOR ATTACHING AN ELECTRONIC MODULE TO A BODY COIL OF A MAGNETIC RESONANCE APPARATUS

BACKGROUND OF THE INVENTION

1. Field of the Invention

The present invention concerns a circuit board and a method to mount an electronic module on a whole-body coil of a magnetic resonance apparatus.

2. Description of the Prior Art

Magnetic resonance systems for the examination of patients, in particular for magnetic resonance tomography, are known from DE10314215B4, for example.

The manufacture of large MR whole-body resonators (body coils) for magnetic resonance tomography apparatuses (MR or MRT) requires substantial manual labor to attach electrical and mechanical components on the outer surface of the cylindrical support tube of the coil (made of GFK—glass-fiber reinforced plastic—for example) with a diameter of up to 70 cm and a length of up to almost 2 m. Due to the large curvature of the support tube, pre-population of electrical components on support circuit boards and their integration is possible only to a limited extent.

For this reason, conventional electronic modules are used that are suitable for manual soldering.

Certain electronic modules—for example capacitors in particular, but also PIN diodes used for the detuning of an MR whole-body resonator—are somewhat more expensive when used in a configuration suitable for manual soldering.

The manual population of modules in SMD (Surface Mounted Device) form/configuration can likewise entail problems such as a difficult manipulation capability of the miniature components, poor soldering capability of the components that have no soldering lugs or soldering wires, endangerment of the components during the soldering due to overheating or mechanical overloading upon contraction of the solder bead, and endangerment due to electrostatic discharge (ESD), even in a protected environment.

SUMMARY OF THE INVENTION

It is an object of the invention to enable an efficient, optimally cost-effective attachment of components to a magnetic resonance apparatus, in particular to a whole-body coil of a magnetic resonance apparatus.

The invention concerns a circuit board with conductive contact regions located at least in the area of an edge of the circuit board, with which contact regions contacts of an electronic module for a magnetic resonance apparatus are connected in a conductive manner.

The invention also concerns a method to mount an electronic module on a whole-body coil of a magnetic resonance apparatus, wherein a circuit board on which the module is located is removed from a retention frame supporting the circuit board and contact regions of the circuit board are connected with contacts on the part of the whole-body coil.

According to the invention, the mounting of components, in particular on a whole-body coil of a magnetic resonance apparatus, can be significantly simplified.

According to an embodiment of the invention, the retention frame is electrically conductive and is connected in an electrically conductive manner with at least one part of the contact region of one or more circuit boards which can connect the contacts of modules.

According to one embodiment of the invention, multiple circuit boards that can be individually removed from the retention frame are held in said retention frame.

DESCRIPTION OF THE PREFERRED EMBODIMENTS

Figure 1:
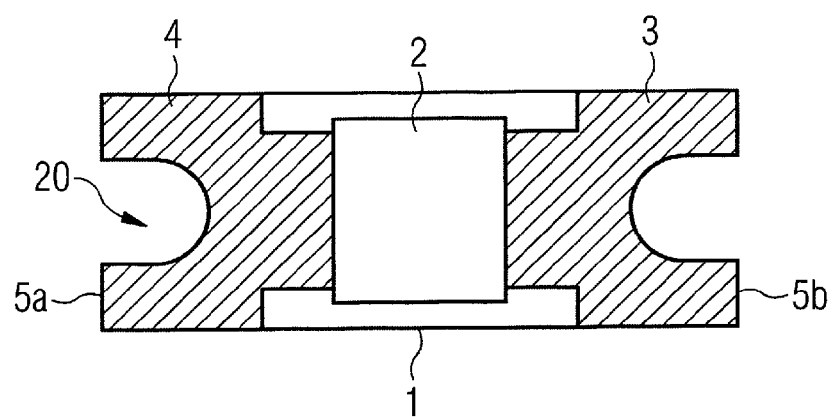
FIG. 1 is a view of a circuit board with a module thereon and lateral contact regions.

FIG. 1 shows a circuit board 1 with an electronic module 2 and two contact regions 3, 4 in the edge areas 5a, 5b of the circuit board. A contact region 3 is connected with one contact of the circuit board 2 and an opposite contact region 4 is connected with an additional contact of the module 2. The contact regions 3, 4 can be flat, formed of a metal layer (tin, etc.) on the circuit board 1, for example, and extend at least up to a contact of a component 2, with which contact they are connected. An edge of the circuit board 1 has a U-shaped recess 20 therein.

Figure 2:
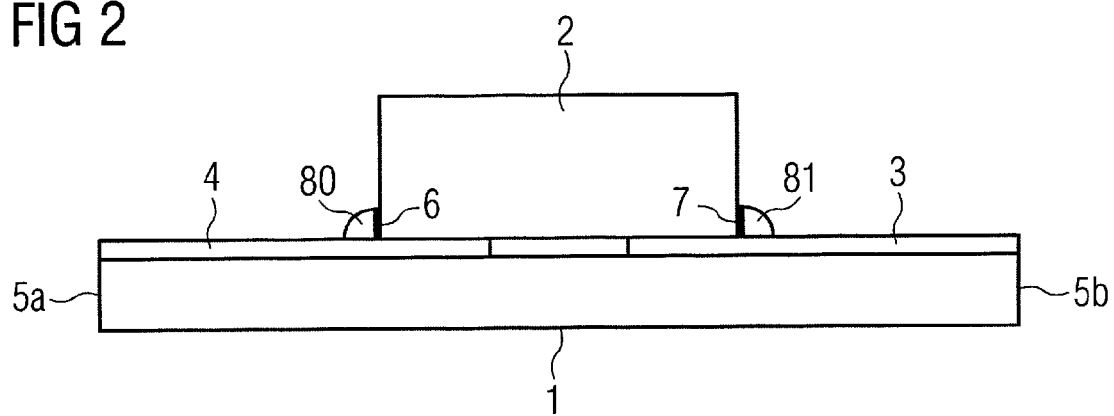
FIG. 2 is a cross section view of a circuit board with contacts of a component and lateral contact regions.

FIG. 2 shows a cross section view of a circuit board 1 that shows. As am example, the contact region 3 in electrical connection with a contact 7 of the module 2, and an opposite (with regard to an axis vertical relative to the circuit board 1 in FIG. 3 and through the circuit board 1) the contact region 4 in electrical connection with an additional contact 6 of the module 2. the electrical connections are made with solder sound 80 and 81

Figure 3:
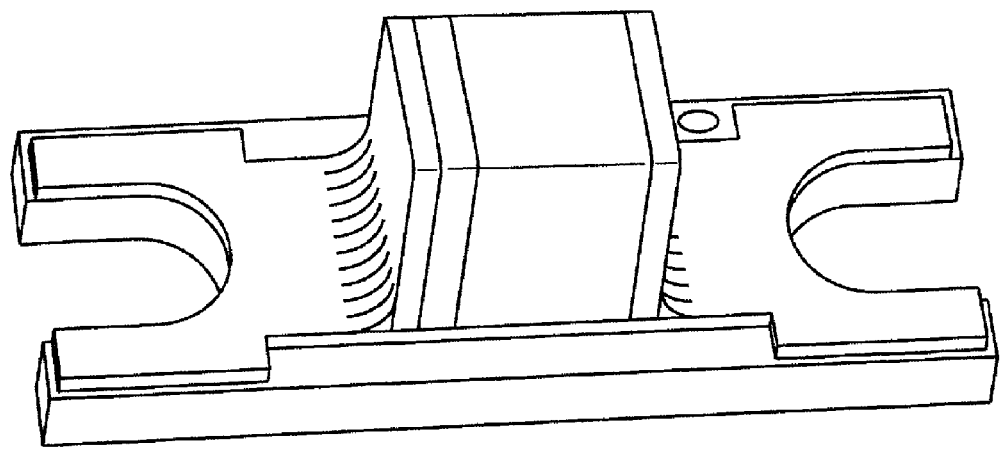
FIGS. 3 and 4 are perspective views of a circuit board with a module thereon and lateral contact regions.
Figure 4:
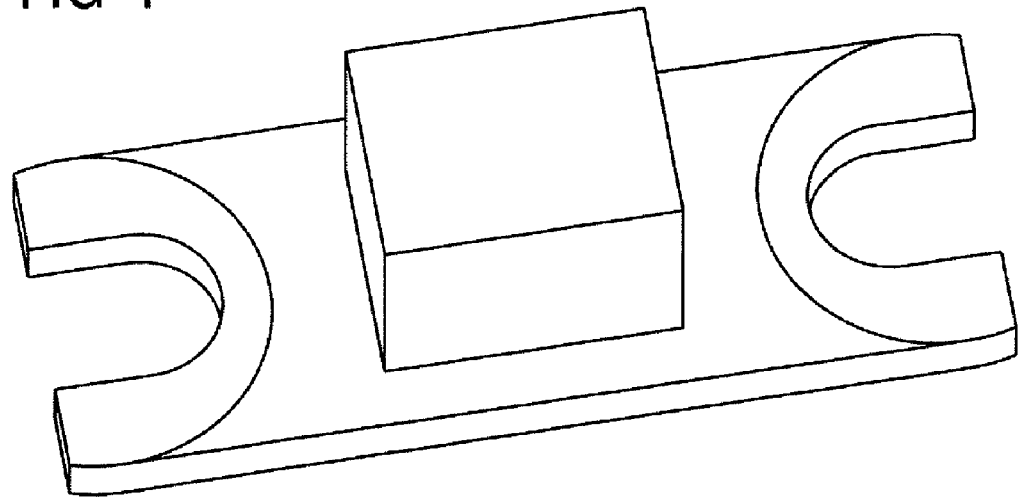

FIGS. 3 and 4 show perspective views of a circuit board 1 with a component thereon.

Figure 5:
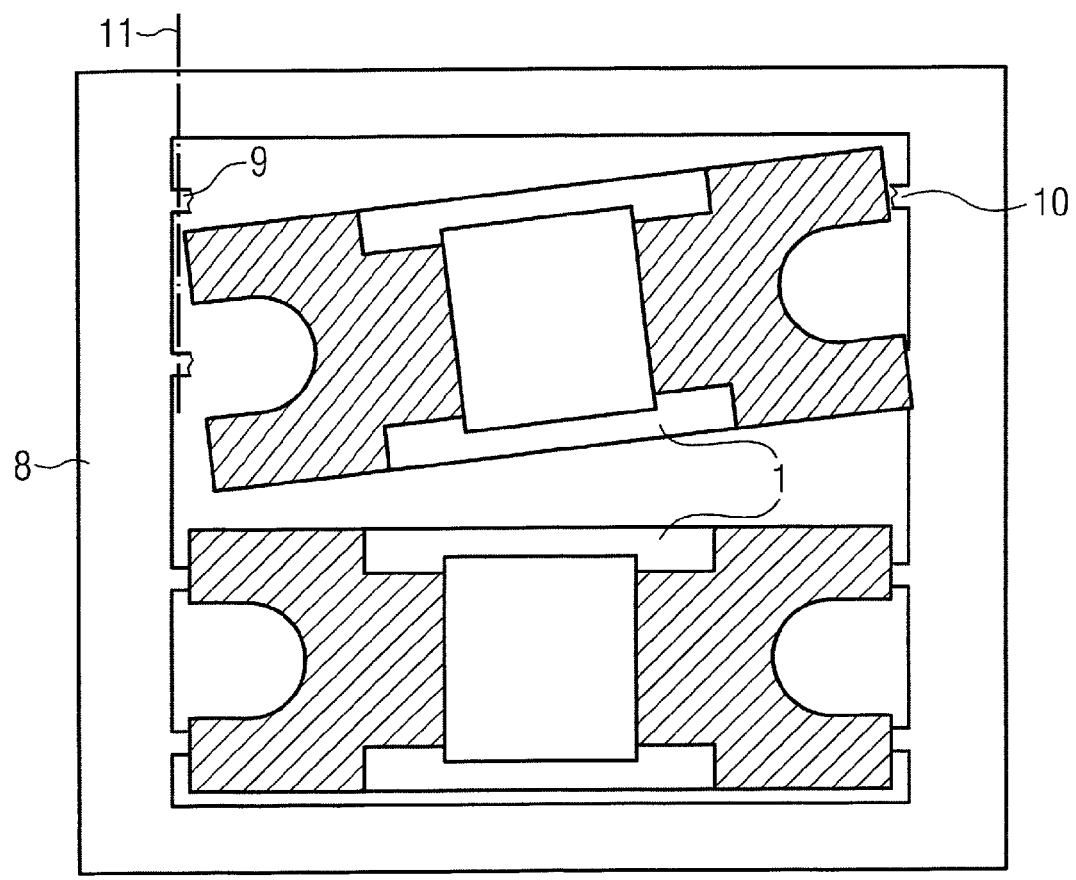
FIG. 5 shows two circuit boards that are held in a metal-coated circuit board frame.

FIG. 5 shows two circuit boards 1 that are held in a metal-coated (here on the top-side surface) circuit board frame 8. Circuit boards 1 are held in retention bridges (webs) 9, 10, etc., here one circuit board in four retention bridges. The retention bridges 9, 10 can be manually broken in order to remove a circuit board 1; for example, a milled groove (fracture line) 11 can be provided for this purpose. The retention bridges 9, 10 here are connected in an electrically conductive manner with the contact regions 3, 4 of all circuit boards 1 and are connected in an electrically conductive manner with the remainder of the frame 1 so that all contacts of a component are connected with one another, which offers protection until installation.

Figure 6:
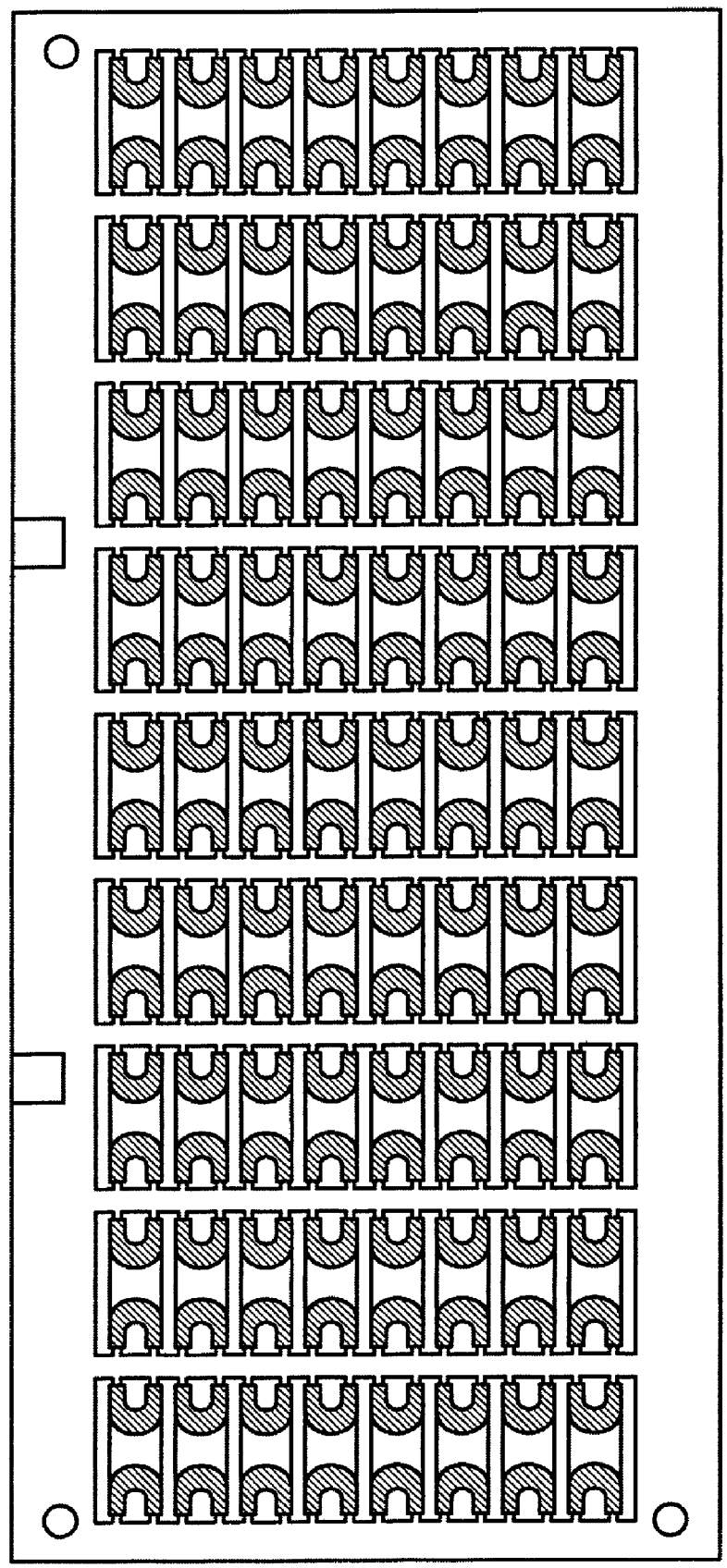
FIG. 6 shows multiple circuit boards that are held in a metal-coated circuit board frame, FIG. 7 schematically illustrates a magnetic resonance tomography system.

FIG. 6 shows multiple circuit boards that are held in a metal-coated circuit board frame.

Figure 7:
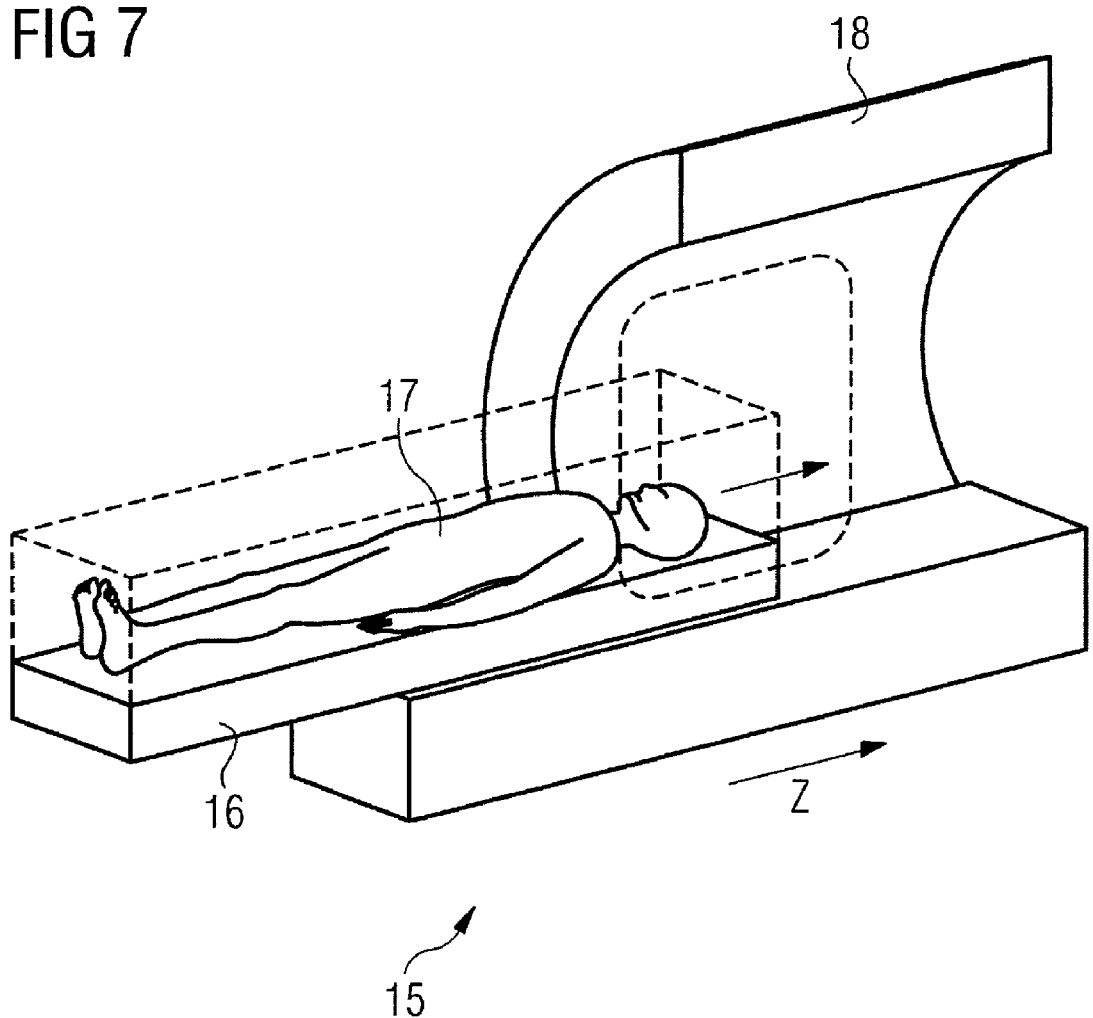
Figure 8:
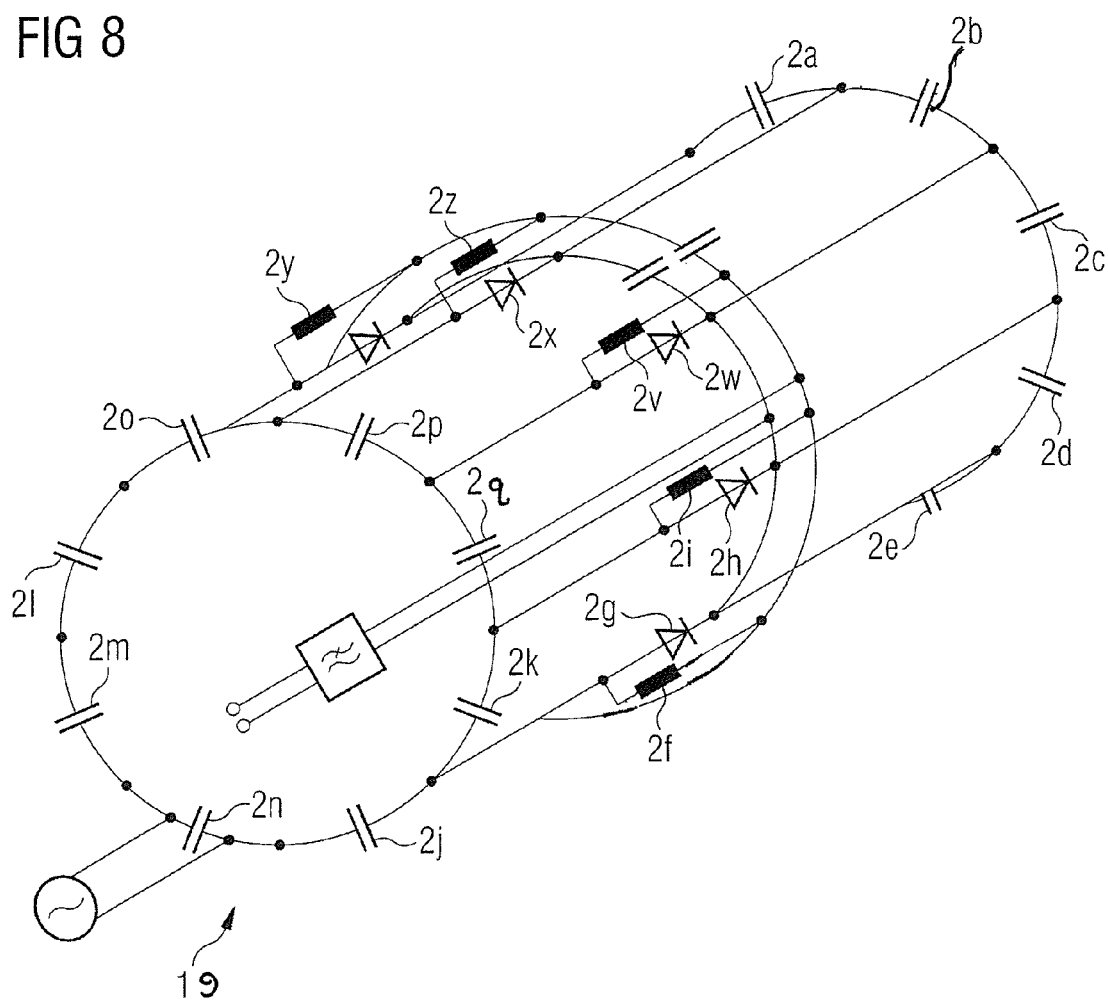
FIG. 8 schematically illustrates the electrical connection of a number of modules to a birdcage magnetic resonance RF whole-body antenna.

FIG. 7 shows a magnetic resonance tomography system 15 with a bed 16 with which a subject or patient 17 is inserted along the direction Z into a scanner 18 having a whole-body resonator 19 therein (see FIG. 8).

According to one embodiment of the invention, PIN diodes (but also capacitors, coils and possibly other components used in the construction of a whole-body coil for a magnetic resonance apparatus MRT) are populated by machine on an intermediate circuit board in a monitored soldering process. This intermediate circuit board 1—which fulfills a supporting function for the module 2 (for example an SMD component)—can have at the edges 5a, 5b a metallization that outwardly connects the contacts or electrodes 6, 7 of the component (component part 2) situated thereon in an electrically conductive manner, thus to a terminal on the part of the MRT after the installation, or to the frame 8 before this installation.

Due to its shape, the circuit board 1 (designated in the following as an intermediate circuit board) should be suited for the manual soldering method. The metallization of the intermediate circuit board should protect against an overheating of the component 2 situated on it in a "piggyback" fashion. This is produced, for example, by both a suitable conductor trace direction within the circuit board 1 and a solder mask (solder resist) applied thereon.

The circuit board should absorb or prevent a mechanical load of the component situated thereon in a "piggyback" manner. For this purpose, it is appropriate both to suitably design the shape of the intermediate circuit board and to optimally choose the thickness of the circuit board for this purpose.

To increase the ESD protection of the component 2, the intermediate circuit board 1 can be formed of said intermediate circuit board 1 itself and a separable, metallized frame. The metallized frame can electrically connect all contacts or electrodes 6, 7 of the intermediate circuit board 1 with one another. This ensures that, during transport and in the bearing of the diode, this is protected (in addition to its ESD packaging) against a possible ESD hazard.

The metallized frame of the circuit board can suitably combine multiple intermediate circuit boards, for example 8 or (as in FIG. 6) nine-times-eight intermediate circuit boards 1 with a larger substrate 8. In transport and during mounting, the component (for example a diode) remains protected by its electrodes 6, 7 shorted over the metallized frame 8. Before the final electrical/mechanical (i.e. Eutectic) connection, such as by soldering, onto the support tube of the body coil in the scanner 18 of an MRT system 16, the intermediate circuit board 1 can be detached from the metallized frame along a milled groove 11, so the shorted connection of its electrodes 6, 7 is disconnected.

FIG. 8 is a circuit diagram of a whole-body antenna 19 in the form of a birdcage antenna, connected to components of a circuit board according to the invention. Any or all of capacitors 2a, 2b, 2c, 2d, 2e, 2k, 2l, 2m, 2n, 2o, 2p, and 2q, resistors 2f, 2i, 2v, 2y, and 2z, and/or diodes 2g, 2h, 2w, and 2x can be formed on a circuit board according to the invention.

Although modifications and changes may be suggested by those skilled in the art, it is the intention of the inventors to embody within the patent warranted hereon all changes and modifications as reasonably and properly come within the scope of their contribution to the art.

We claim as our invention:

1. A circuit assembly comprising:
   a circuit board having an edge;
   conductive contact regions located at least at said edge of said circuit board; said edge having a U-shaped recess therein;
   an electronic module for a magnetic resonance apparatus having module contacts;
   respective electrical connections between said contact regions and said module contacts;
   said conductive contact regions on said circuit board being configured for electrical connection to a whole-body coil of a magnetic resonance apparatus; and
   a retention frame having a central opening therein in which said circuit board is held and having frame regions that define said central opening and are located adjacent to said U-shaped recess, and an electrical connection between said contact region with said U-shaped recess and said retention frame,
   said retention frame being configured to hold said circuit board at said contact regions, and comprising:
      frangible connectors that mechanically connect said contact region to said retention frame; and
      that, upon said frangible connections being broken, allow individual removal of said circuit board from said frame.

2. A circuit assembly as claimed in claim 1 wherein said circuit board has opposite edges and a conductive contact region at each of said opposite edges.

3. A circuit assembly as claimed in claim 1 wherein said circuit board has an upper surface and a lower surface, and wherein said contact regions are located on one of said upper surface or said lower surface.

4. A circuit assembly as claimed in claim 1 wherein each contact region is a metallic or metalized surface.

5. A circuit assembly as claimed in claim 1 comprising at least two contact regions that have no electrical connection with each other when said circuit board is detached from said retention frame.

6. A circuit assembly as claimed in claim 1 wherein said frangible connections are formed by milled grooves.

7. A circuit assembly as claimed in claim 1 wherein said retention frame is electrically conductive and is configured to hold said circuit board therein by a connection between said retention frame and at least a portion of said contact regions.

8. A circuit assembly as claimed in claim 1 wherein said retention frame is configured to hold a plurality of circuit boards, identical to said circuit board, with frangible connections allowing removal of each of said multiple circuit boards from said retention frame.

9. A circuit assembly as claimed in claim 8 wherein said module contacts and said contact regions are configured to place said module contacts in electrical connection with each other only when said circuit board is held in said retention frame.

10. A circuit assembly as claimed in claim 1 wherein said module comprises at least one of a diode, a capacitor or an inductance.

11. A circuit assembly as claimed in claim 1 wherein said module is an SMD module.

12. A circuit assembly as claimed in claim 1 comprising conductor traces on said circuit board leading to said module contacts.

13. A method for attaching an electronic module to a whole-body coil of a magnetic resonance apparatus, comprising the steps of:
   holding a circuit board, on which an electronic module is mounted, in a central opening of a retention frame;
   removing said circuit board with said module thereon from said central opening of said retention frame; and
   electrically connecting contact regions of the circuit board by making an electrical/mechanical (Eutectic) connection in order to form electrical contacts on a whole-body coil of a magnetic resonance apparatus.

14. A method as claimed in claim 13 comprising connecting contact regions of the circuit board with contacts of said whole-body coil by soldering.

15. A method as claimed in claim 14 comprising electrically connecting said circuit board directly to contacts on said whole-body coil.

16. A method as claimed in claim 14 comprising electrically connecting said circuit board to an additional circuit board on said whole-body coil.

* * * * *